United States Patent
Bentley et al.

(10) Patent No.: US 10,325,904 B2
(45) Date of Patent: Jun. 18, 2019

(54) TRANSIENT OVERVOLTAGE PROTECTION DEVICE

(71) Applicant: LITTELFUSE, INC., Chicago, IL (US)

(72) Inventors: Gary Mark Bentley, Chicago, IL (US); James Allan Peters, Chicago, IL (US); Steve Wilton Byatt, Chicago, IL (US)

(73) Assignee: LITTELFUSE, INC., Chicago, IL (US)

( * ) Notice: Subject to any disclaimer, the term of this patent is extended or adjusted under 35 U.S.C. 154(b) by 0 days.

(21) Appl. No.: 15/908,903

(22) Filed: Mar. 1, 2018

(65) Prior Publication Data

US 2018/0190643 A1 Jul. 5, 2018

Related U.S. Application Data

(62) Division of application No. 14/678,005, filed on Apr. 3, 2015, now Pat. No. 9,941,264.

(51) Int. Cl.
*H01L 27/02* (2006.01)
*H01L 29/66* (2006.01)
*H01L 29/861* (2006.01)
*H01L 29/06* (2006.01)

(52) U.S. Cl.
CPC ...... *H01L 27/0255* (2013.01); *H01L 29/0661* (2013.01); *H01L 29/66121* (2013.01); *H01L 29/861* (2013.01)

(58) Field of Classification Search
None
See application file for complete search history.

(56) References Cited

U.S. PATENT DOCUMENTS

| 4,435,225 A * | 3/1984 | Shideler | H01L 21/82 |
| | | | 257/515 |
| 6,353,236 B1 * | 3/2002 | Yatsuo | H01C 7/10 |
| | | | 257/119 |

* cited by examiner

*Primary Examiner* — Andres Munoz

(57) ABSTRACT

In one embodiment, an overvoltage protection device may include a semiconductor substrate comprising an n-type body region. The overvoltage protection device may further include a first p-type region disposed in a first surface region of the semiconductor substrate, and forming a first P/N junction with the n-type body region, and a second p-type region disposed in a second surface region of the semiconductor substrate opposite the first surface, and forming a second P/N junction with the n-type body region, wherein the n-type body region, first p-type region, and second p-type region form a breakdown device having a breakdown voltage greater than 100V when an external voltage is applied between the first surface region and second surface region.

14 Claims, 6 Drawing Sheets

TRANSIENT OVERVOLTAGE PROTECTION DEVICE

CROSS REFERENCE TO RELATED APPLICATIONS

This application is a divisional of, and claims the benefit of priority to, U.S. patent application Ser. No. 14/678,005, filed Apr. 3, 2015, entitled "Transient Overvoltage Protection Device," which application is incorporated herein by reference in its entirety.

FIELD

Embodiments relate to the field of circuit protection devices, and more particularly to semiconductor devices for protection against transient overvoltage.

DISCUSSION OF RELATED ART

Semiconductor devices are widely used to provide protection against transient conditions, such as transient overvoltage events by taking advantage of the properties of P/N junctions. In a P/N junction an interface is formed between a region of the semiconductor device having a first conductivity type (P or N) and a second region having a second conductivity type opposite the first conductivity type (N or P). To form some conventional transient protection devices, a semiconductor substrate having a conductivity of a first type is exposed to implantation, diffusion, or deposition of species of a second type, including expitaxial growth of a layer having species of the second type. After the species of the second type is provided, annealing may be performed to diffuse and activate the species of second conductivity type. In this manner a Zener diode or avalanche breakdown diode may be formed for limiting voltage to levels of several volts to several hundred volts.

One disadvantage of using a single PN junction diode is that series resistance within the diode increases the voltage drop across the diode during high current transients. This increases the voltage window between the non-conducting voltage and high current clamping voltage and therefore limits the maximum operating voltage of the protected circuit. In applications such as switching inverters, it may be useful to operate the circuit at the highest possible switching voltage for highest efficiency. A wide protection voltage window may compromise the efficiency of the switching inverter.

In some instances an avalanche voltage temperature coefficient is in the range of 0.1% per degree Celsius for a silicon PN diode. Internal heating of the PN junction occurs during a current transient and this heating causes and increase in the avalanche voltage. A protection voltage window may accordingly be increased to include the effects of temperature rise during operation.

In some applications, it may be useful to protect AC voltages. In these circumstances, a pair of PN diodes may be connected back-to-back in series to provide protection for two opposite voltage polarities. In this situation, the sum of the series resistance from the forward conducting diode and the avalanching diode again increases the protection voltage window.

In an attempt to reduce the series resistance of the protection diode, the device may be fabricated on an epitaxial layer of silicon grown on a low resistivity substrate. The PN junction may be formed in the epitaxial layer by similar methods described for the non-epitaxial diode. Notably, the problem of the finite temperature coefficient of avalanche voltage that expresses the change in avalanche voltage with change in temperature remains.

In other work an NPN device structure has been fabricated by forming an n-region on opposite sides of a p-doped semiconductor die. Known methods for forming overvoltage protection devices in semiconductors are capable of generating single devices having breakdown voltage values in the range 15-30V, with possibilities to extend breakdown voltage to 40 V. This structure also behaves like a transistor in the avalanche mode. Electrons injected into the P-type base region from the N-type emitter diffuse across the P-type base and reach the avalanche region at the collector. These additional charge carriers reduce the avalanche voltage of the collector junction to give the known foldback BVceo (breakdown voltage, collector-emitter, base open) characteristic of a transistor. This effect is used to advantage in the 15-30V avalanche voltage range to compensate for the voltage increase due to series resistance. The gain of a transistor depends on the doping of the base region, and the gain increases as the doping is reduced. If the transistor gain is too high then, BVceo can reduce to lower than the stand-off voltage of the protection diode. In practice, this consideration means the maximum voltage of the protection diode is limited to about 30V. In view of the above, it may be useful to provide overvoltage protection for higher voltage levels. It is with respect to these and other issues the present improvements may be desirable.

SUMMARY

In one embodiment, an overvoltage protection device may include a semiconductor substrate comprising an n-type body region. The overvoltage protection device may further include a first p-type region disposed in a first surface region of the semiconductor substrate, and forming a first P/N junction with the n-type body region, and a second p-type region disposed in a second surface region of the semiconductor substrate opposite the first surface, and forming a second P/N junction with the n-type body region, wherein the n-type body region, first p-type region, and second p-type region form a breakdown device having a breakdown voltage greater than 100 V when an external voltage is applied between the first surface region and second surface region.

In another embodiment, a method of fabricating a semiconductor device may include providing an n-type semiconductor substrate, forming a first p-type region in a first surface region of the semiconductor substrate, the first p-type region forming a first P/N junction with the body region, and forming a second p-type region in a second surface region of the semiconductor substrate opposite the first surface, the second first p-type region forming a second P/N junction with the body region, wherein the n-type semiconductor substrate forms an n-type body region disposed between the first p-type region and second p-type body region, wherein the forming the first p-type region and forming the second p-type region comprise driving a p-type dopant into the first p-type region and second p-type region in a plurality of drive-in operations, and wherein the n-type body region, first p-type region, and second p-type region form a breakdown device having a breakdown voltage greater than 100V when an external voltage is applied between the first surface region and second surface region.

In an additional embodiment, an overvoltage protection device may include a plurality of semiconductor die and at least one electrical connection between a first semiconductor die and second semiconductor die, wherein the plurality of semiconductor die are connected in electrical series. At least one semiconductor die of the plurality of semiconductor die may include a first p-type region disposed on a first surface of the semiconductor substrate, and forming a first P/N junction with the body region; and a second p-type region disposed on a second surface of the semiconductor substrate opposite the first surface, and forming a second P/N junction with the body region, wherein the n-type body region, first p-type region, and second p-type region form a breakdown device having a breakdown voltage greater than 100V when an external voltage is applied between the first surface region and second surface region, and wherein the overvoltage protection device has a breakdown voltage greater than 200V.

DESCRIPTION OF EMBODIMENTS

Figure 1A:
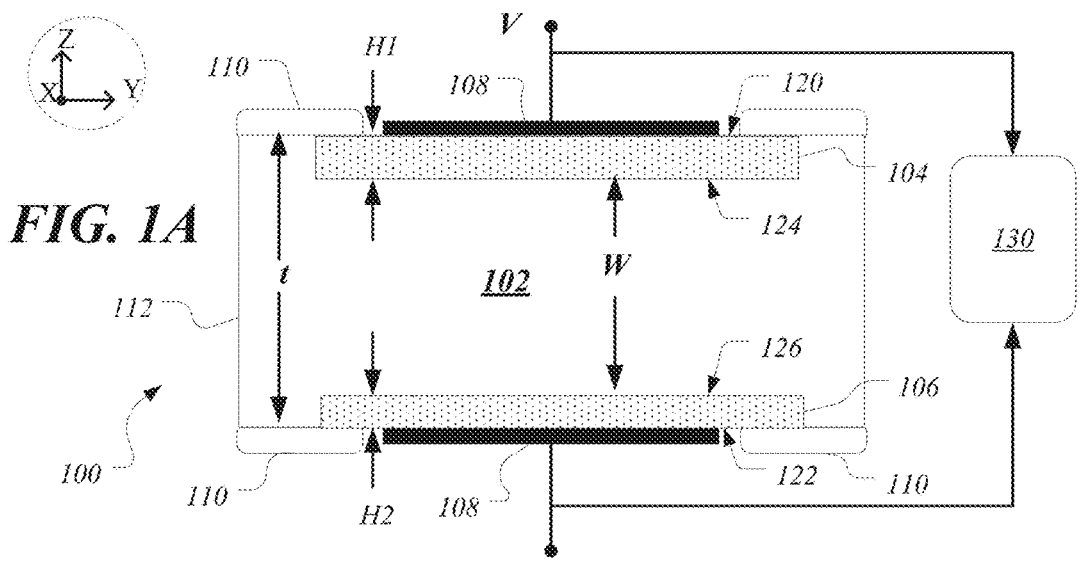
FIG. 1A presents a side cross-sectional view of an overvoltage protection device according to embodiments of the disclosure.

The present embodiments will now be described more fully hereinafter with reference to the accompanying drawings, in which various embodiments are shown. The embodiments may be embodied in many different forms and are not to be construed as limited to the embodiments set forth herein. These embodiments are provided so that this disclosure will be thorough and complete, and will fully convey the scope of the embodiments to those skilled in the art. In the drawings, like numbers refer to like elements throughout.

In the following description and/or claims, the terms "on," "overlying," "disposed on" and "over" may be used in the following description and claims. "On," "overlying," "disposed on" and "over" may be used to indicate when two or more elements are in direct physical contact with one another. The terms "on,", "overlying," "disposed on," and over, may also mean when two or more elements are not in direct contact with one another. For example, "over" may mean when one element is above another element and not in contact with another element, and may have another element or elements in between the two elements. Furthermore, the term "and/or" may mean "and", it may mean "or", it may mean "exclusive-or", may mean "one", may mean "some, not all", may mean "neither", and/or it may mean "both." The scope of claimed subject matter is not limited in this respect.

The present embodiments are generally related to transient protection devices formed within a semiconductor substrate such as silicon. Various embodiments involve a three layer device structure and method of forming the device structure. A three layer device may be formed by providing a semiconductor substrate that is doped using a first dopant type. A second dopant type may be introduced into opposite sides of the semiconductor substrate to form a PNP or NPN device structure that is made of three semiconductor layers. The three layers effectively constitute a very wide base transistor (or triode) having a collector and emitter formed from diffused regions onto opposite sides of the body of the substrate, which renders the device bi-directional. Accordingly, by interchanging the bias on the collector/emitter electrodes an avalanche breakdown may be produced in opposite P/N junctions for either bias condition. Asymmetric breakdown voltage can also be produced. The 'body' of such a three layer (transistor) in the absence of effect of external current has an avalanche breakdown that is modified by gain as the current through the structure. As the gain changes with respect to current so does the breakdown voltage.

In particular embodiments, a high breakdown voltage device is provided by forming p-type dopant regions on opposite sides of a semiconductor wafer or semiconductor die. In some embodiments, a first p-type region and second p-type region are formed on the opposite sides of an n-type monocrystalline silicon substrate. In various embodiments, the n-type dopant concentration of n-dopant in the monocrystalline substrate may be between $1E13/cm^3$ to $1E16/cm^3$. In some embodiments, at least one p-type region, or the two p-type regions may be doped at a concentration levels of $1E18/cm^3$ to $1E21/cm^3$. In some embodiments, the thickness of the p-type regions may vary between 5 μm to 30 μm.

As detailed below, by careful control of the doping process, a three layer device may be generated that exhibits a high breakdown voltage ($V_B$), such as 100 V or greater within just one semiconductor die. This level of breakdown voltage is not realized by the aforementioned conventional devices. As a result, the present embodiments provide various advantages over known devices and processes. For one, a single-die device may be fabricated for protecting components or circuits where operating voltage is in excess of 100 V. For another, in some embodiments single-die devices may be electrically coupled in series with one another to generate an overprotection device having a breakdown voltage in excess of 1000 V. In this manner, electrical components, circuits, or systems where operating voltage exceeds 1000 V may be protected. In additional embodiments, as discussed below, fabrication of a three layer device may be tailored to provide a target amount of voltage foldback.

FIG. 1A depicts a device 100 according to embodiments of the disclosure. In some implementations the device 100 may function as an overvoltage protection device, such as a transient voltage suppression (TVS) device, arranged to protect an external component, including an electrical device, electrical circuit, group of devices, or electrical system. The device 100 may be formed from a monocrystalline semiconductor material such as monocrystalline silicon. The device 100 may be formed from a semiconductor substrate 112 that includes a body region 102, where the body region 102 is formed by doping the semiconductor substrate 112. In some embodiments, the semiconductor substrate 112 may be uniformly doped with a given dopant that forms the body region 102, meaning the dopant level of the given dopant between surface 120 and surface 122 (along the Z-direction of the Cartesian coordinate system shown) is uniform. In some embodiments, the body region 102 may be n-doped having a concentration of n-type dopants between $1E13/cm^3$ to $1E16/cm^3$. In particular embodiments, the dopant concentration in the body region 102 may be tailored to generate a resistance in the range of 1 Ohm-cm to 5 Ohm-cm, corresponding to an n-type dopant level of $1E16/cm^3$ to $1/E14/cm^3$, for example. The embodiments are not limited in this context. In particular embodiments, the body region may be doped using phosphorous. An exemplary range for the thickness t of device 100 between surface 120 and surface 122 may be 200 µm to 1 mm. The embodiments are not limited in this context.

As further shown in FIG. 1A, the device 100 includes a first doped region 104 disposed adjacent the surface 120 and a second doped region 106 disposed adjacent the surface 122. The first doped region 104 and second doped region 106 may constitute first p-type region and a second p-type region in embodiments in which the body region is n-doped. In various embodiments, the thickness H1 of the first doped region 104 and thickness H2 of second doped region 106 may individually be within the range of 10 µm to 30 µm. Accordingly, the collective thickness of the two doped regions may be a small fraction of the thickness of the device 100, and may be a small fraction of the width W of the body region 102 between the first doped region 104 and second doped region 106. In accordance with some embodiments, the first doped region 104 and second doped region 106 may comprise boron-doped regions having an active dopant concentration (the term "dopant concentration" may mean "active dopant concentration" unless otherwise noted herein) of between $1E18/cm^3$ and $1E21/cm^3$. The embodiments are not limited in this context.

In accordance with various embodiments, the first doped region 104 and second doped region 106 may be formed by a plurality of drive-in operations. In conjunction with a given drive-in operation, a dopant may be introduced to the semiconductor substrate 112 or near the surface 120 or surface 122. The dopant may be introduced by exposure to an ambient containing the dopant as a vapor, by deposition of a layer containing the dopant, by ion implantation of ions containing the dopant, or any combination of the above. The semiconductor substrate 112 may be heated during exposure to the ambient containing the dopant. In particular embodiments, deposition of the dopant may take place by heating a material such as a boron-containing material, or boron source, in a furnace or other heater. In various embodiments, the boron source may be a solid source, a liquid source, or a vapor source. When heated, boron may evaporate from the boron-containing solid material or liquid material, and may condense on the semiconductor substrate 112. In some embodiments, the boron source may be provided as a liquid or vapor source that does not require heating. In particular embodiments, $BBr_3$ may serve as a boron source. The dose of boron received from a boron source and the substrate temperature of semiconductor substrate 112 may be tailored to deposit a predetermined amount of boron having an initial dopant profile on the semiconductor substrate 112. The predetermined amount of boron may then be diffused into the semiconductor substrate 112 in a subsequent drive-in operation to establish a target dopant profile according to target device properties.

In various embodiments, a drive in operation may be performed by placing the semiconductor substrate 112 into a furnace or other apparatus after deposition of a boron material at the surface 120, surface 122, or the two surface. The semiconductor substrate 112 may then be heated to a target temperature for a target duration. The present inventors have discovered novel combinations of deposition and drive in operations to generate high breakdown voltage in a three layer device such as the device 100, where semiconductor a three layer device may be $V_B$ may be 100 V or greater.

In various embodiments, at least one drive-in operation is conducted by heating a furnace to a temperature between 1300° C. and 1350° C. for a duration of between five hours and thirty hours. This drive in operation may be performed in conjunction with at least one additional drive in operation, to result in a final doped region, as exemplified by the first doped region 104 and second doped region 106. In some instances the surface 120 and surface 122 of the semiconductor substrate 112 may be patterned with at least one mask structure, shown as mask structure 110. The mask structure 110 may be an oxide that is patterned so as to form a window or windows effective to provide exposed regions of the semiconductor substrate 112 for introducing dopants.

The above processes may be designed to generate a resultant structure in the device 100 tailored to provide a target set of properties, such as a target breakdown voltage $V_B$, and a target residual voltage $V_M$ characteristic of the device 100 at high current levels after breakdown, as described below. For example, for protection of a circuit 130 designed to operate at a range between 200V to 300V, the device 100 may be designed with a $V_B$ of 350V and a $V_M$ of 250V. The exact value of $V_B$ may be controlled by controlling the drive-in operation conditions discussed above. In turn, the control of the drive-in operation conditions may control the doping of the substrate 112, and result in a target doping profile of the first doped region 104 and second doped region 106.

In operation, a voltage transient may be experienced that is conducted between a first contact and second contact on opposite sides of the device 100, shown as the contacts 108. When a voltage transient is experienced across the device 100, the voltage V may bias the P/N junction 124 in a forward direction in one instance. The P/N junction 126 may then be biased in the reverse direction. When the level of the voltage transient exceeds $V_B$ the P/N junction 126 may breakdown. In exemplary embodiments the device 100 may exhibit voltage foldback where the voltage decreases with increased current after voltage breakdown occurs. The level of voltage foldback may be designed to reduce voltage from the peak or breakdown voltage, to a target residual voltage $V_M$ that may lie within an operating voltage of a circuit, device or system to be protected. The shape of a current-voltage characteristic in a foldback region may also by adjusted as described below.

In various embodiments, the dopant concentration at a P/N junction 124 between the body region 102 and the first doped region 104, or at a P/N junction 126 between the body region 102 and second doped region 106, may range between $1E14/cm^3$ and $1E18/cm^3$. In addition, in order to ensure proper high voltage breakdown, the surface dopant concentration may be set so as to prevent the depletion region (not shown) near the P/N junctions from spreading back to the surface 122 or surface 120. In various embodiments a surface dopant concentration may range between $1E19/cm^3$ and $1E20/cm^3$. The embodiments are not limited in this context. In order to achieve this dopant profile, a first introduction of dopant may be performed to introduce a first amount of dopant, such as $5E13/cm^2$ boron. The first introduction of dopant may be followed by a first drive in operation for 10 hours at 1300° C., forming a deep P/N junction away from the surface 120 or surface 122. The embodiments are not limited in this context. This first introduction of dopant and first drive in operation may be followed by a second introduction of dopant to deposit a second amount of dopant, such as boron. Subsequently a second drive in operation may be performed at 1300° C. for one hour. The embodiments are not limited in this context. In this manner, a high concentration of dopant of at least 1E19/cm$^3$ may be generated at the surface 120 and surface 122, while maintaining a P/N junction 124 or P/N junction 126 at a target depth having the target dopant concentration.

In some embodiments the first doped region 104 and second doped region 106 may be p-type regions and the first doped region 104 may have a first dopant profile while the second p-type region 106 has a second dopant profile matching the first dopant profile.

Figure 1B:
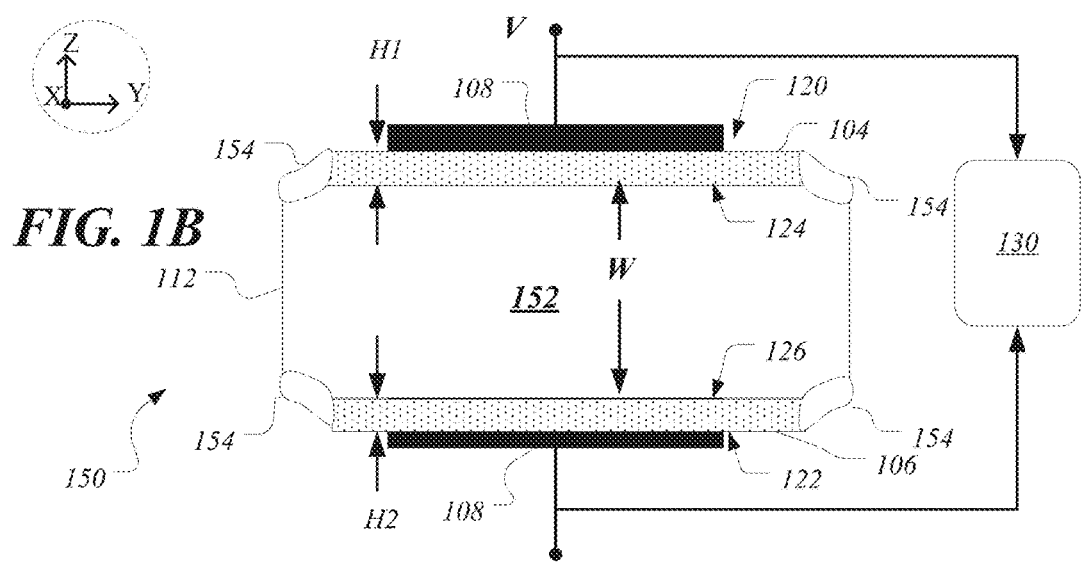
FIG. 1B presents a side cross-sectional view of a further overvoltage protection device according to embodiments of the disclosure.

Moreover, in other embodiments opposed doped regions, such as first doped region 104 and second doped region 106 may be formed in a mesa-type silicon device structure. FIG. 1B depicts a side cross-sectional view of a further overvoltage protection device, shown as device 150, according to embodiments of the disclosure. The device 150 shares common features with the device 100, save the mesa-type structure defined by the body region 152 and first doped region 104 and second doped region 106. In this example, the device 150 may be formed by mesa etching the semiconductor substrate 112 and passivating the P/N junction 124 and P/N junction 126 with a layer of glass patterned to form the passivation regions 154.

Figure 2:
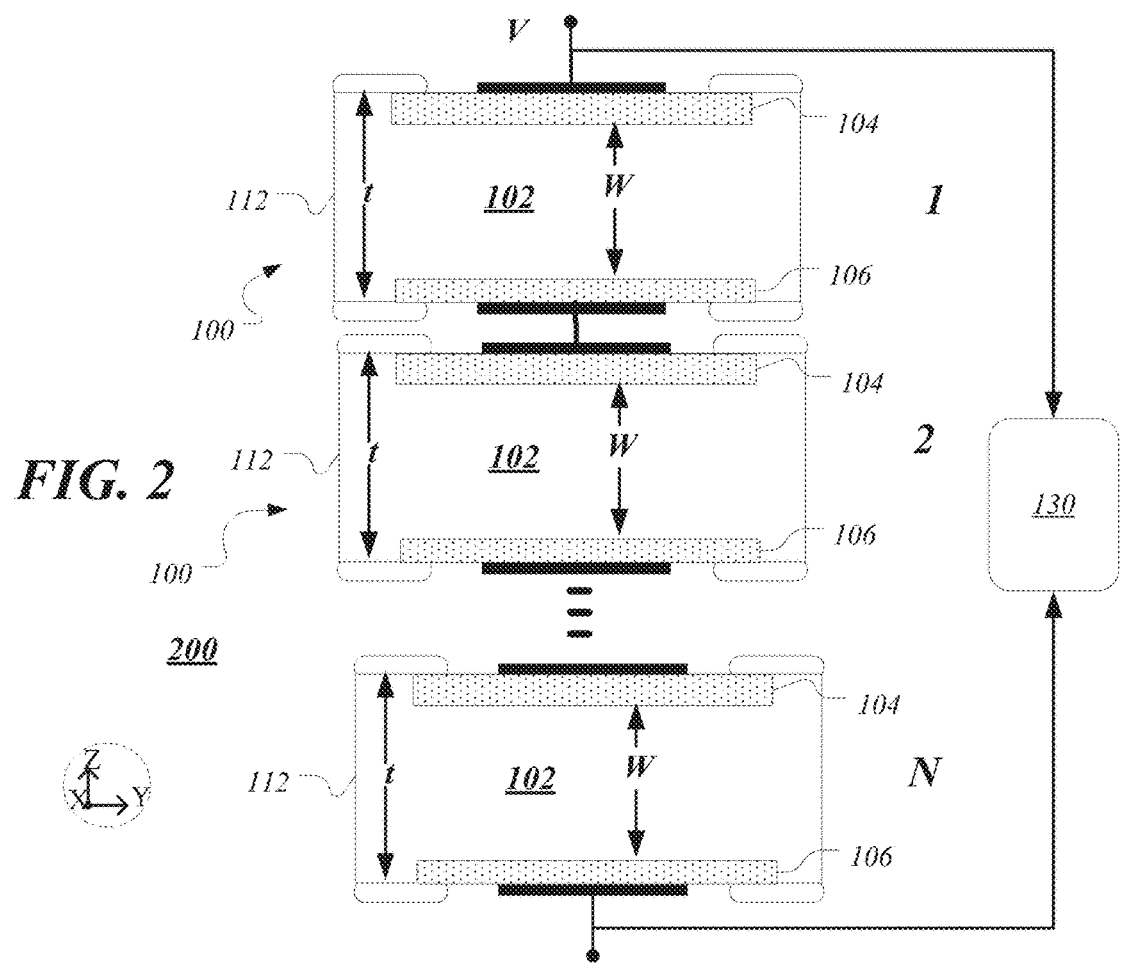
FIG. 2 presents a side cross-sectional view of another overvoltage protection device according to other embodiments of the disclosure.

FIG. 2 depicts a device 200 arranged according to further embodiments of the disclosure. The device 200 includes a plurality of devices 100 that are electrically connected in electrical series. In various embodiments, a device 100 may constitute a silicon die having a predetermined size. In this manner, the various die may be electrically connected together to generate a total breakdown voltage $V_T$ of the device 200 that is a sum of the individual breakdown voltages of the individual devices, such as devices 100. In embodiments in which $V_B$ is the same for all the devices 100, then $V_T=NV_B$. As an example, the device 200, when composed of 10 devices 100 that have an individual breakdown voltage of 350 V, has a $V_T$ of 3500V. This level of $V_T$ may be useful to protect circuits that operate at 3000 V, for example.

In a variant of the device 200 other devices may be constructed from a plurality of mesa-type devices, such as the device 150, arranged in electrical series. The embodiments are not limited in this context.

Returning now to FIG. 1A, in some embodiments, the first doped region 104 may differ from the second doped region 106. For example H1 may differ from H2, the dopant concentration at surface 120 may differ from the dopant concentration at surface 122, the dopant concentration at P/N junction 124 may differ from the dopant concentration at P/N junction 126, and so forth. Any of these circumstances generates an asymmetrical device where the breakdown voltage may vary in different direction or where the residual voltage may vary in different directions. This asymmetrical device structure may be useful for example, in cases of DC supply transmission where different protection voltages may be specified under fault conditions (supply reversal. In one example the asymmetrical device structure may be generated by a combination of masking and deposition so that a relatively deeper junction is created on one side or face of the substrate material and a relatively shallower junction is created on the opposing side or face of the substrate material, with corresponding doping concentrations at the respective junctions to generate different desired breakdown voltages at different voltage polarities. The resulting device may have foldback in one or two conduction directions in such an asymmetrically structured device.

As an example 1 for generating a VB of 250V, a silicon substrate (wafer) may be provided having an active dopant concentration of 3E15/cm$^3$ phosphorous, yielding a resistivity of 1.6 Ohm-cm. Boron deposition may be performed at 1100° C. for 1 hour, generating resistance of 0.5 Ohms/square on opposite surfaces of the silicon substrate. Subsequently a drive in operation may be performed for 1 hour at 1300° C.

Figure 3A:
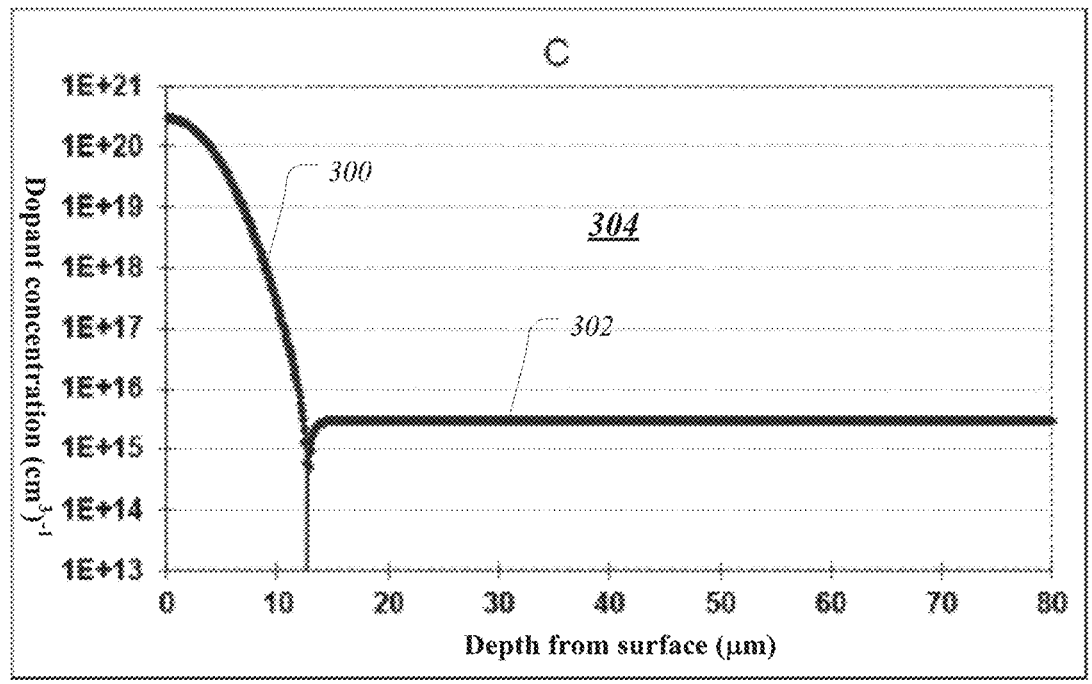
FIG. 3A depicts an exemplary dopant profile of an overvoltage protection device according to various embodiments of the disclosure.

FIG. 3A depicts an exemplary dopant profile, shown as dopant profile 300, of an overvoltage protection device that may be generated according to the recipe of example 1. In this example, the dopant profile 300 exhibits a surface dopant concentration of nearly 3E20/cm$^3$ while the dopant concentration decreases to a background level of 3E15/cm$^3$ at a depth of 12 μm below the surface, corresponding to the location of a P/N junction given the dopant level 302 (3E15/cm$^3$) of the phosphorous in the N-type body region 304. In a symmetrical device, a profile that matches the dopant profile 300 in shape and absolute value, and forms a mirror image of the dopant profile 300 may be produced on the right side of the figure. Depending upon the thickness of a substrate, the N-type body region 304 may extend for 100 μm up to 1 mm between opposite regions characterized by dopant profile 300.

As an example 2 for generating a VB of 430 V, a silicon substrate (wafer) may be provided having an active dopant concentration of 3E15/cm$^3$ phosphorous, yielding a resistivity of 1.6 Ohm-cm. In one operation, boron may be implanted using boron-containing ions into the silicon substrate using ion implantation at a dose of 5E13/cm$^2$. Subsequently a drive-in anneal may be performed at 1300 C for 10 hours. In a subsequent operation, boron may be deposited at 1100 degrees ° C. for 1 hr yielding a resistance of 0.5 Ohm/square. A subsequent drive in operation may be performed for one hour at 1300° C.

Figure 3B:
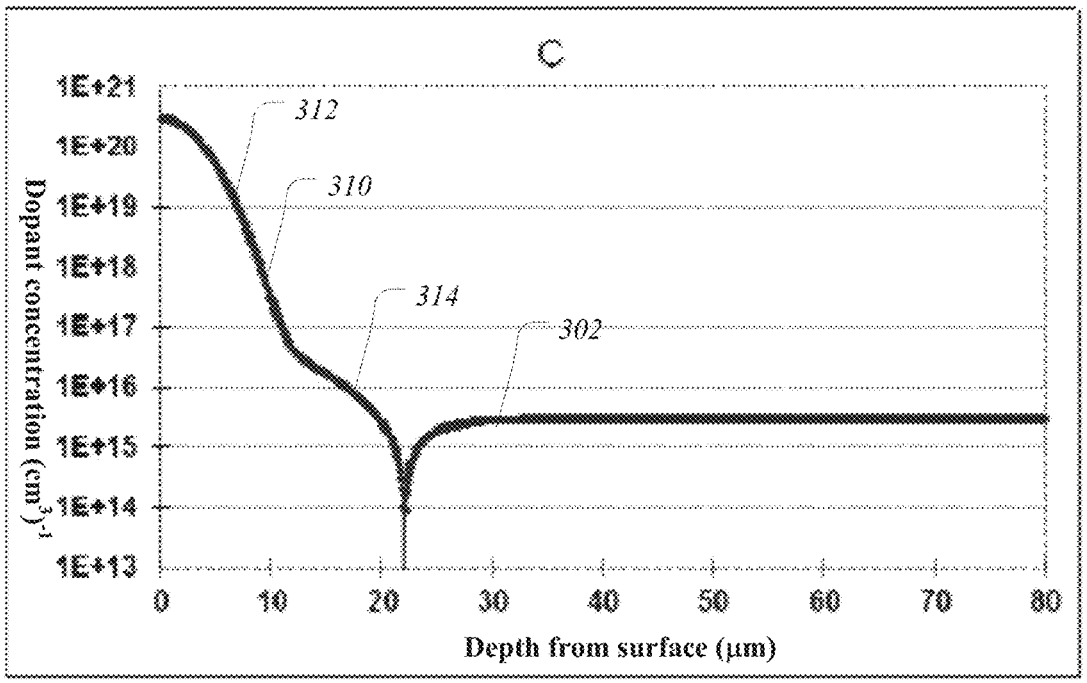
FIG. 3B depicts another exemplary dopant profile of an overvoltage protection device according to various embodiments of the disclosure.

FIG. 3B depicts a dopant profile 310 of an overvoltage protection device that may be generated according to the recipe of example 2. In this example, the dopant profile 310 exhibits a surface dopant concentration of nearly 3E20/cm$^3$ while the dopant concentration decreases to a background level of 3E15/cm$^3$ at a depth of 20 to 22 μm below the surface, corresponding to the location of a P/N junction given the dopant level 302 (3E15/cm$^3$) of the phosphorous in the N-type body region 326. In this example, the dopant profile 310 has a surface portion 312 decreasing rapidly to a concentration of approximately 3E16/cm$^3$ at a depth of 10 μm below the surface. The dopant profile 310 also has a sub-surface portion 314 adjacent the surface portion 322. The sub-surface portion 324 exhibits a gradual drop between approximately 3E16/cm$^3$ at a depth of 10 μm below the surface, gradually decreasing to the background level of 3E15/cm$^3$ at a depth of 20-22 μm below the surface.

In additional examples, an asymmetrical device may be generated in which a 250V breakdown voltage is established in one direction by processing one surface of a silicon substrate in accordance with example 1, and by processing a second surface of the silicon substrate in accordance with example 2 to generate a 450V breakdown voltage.

Figure 3C:
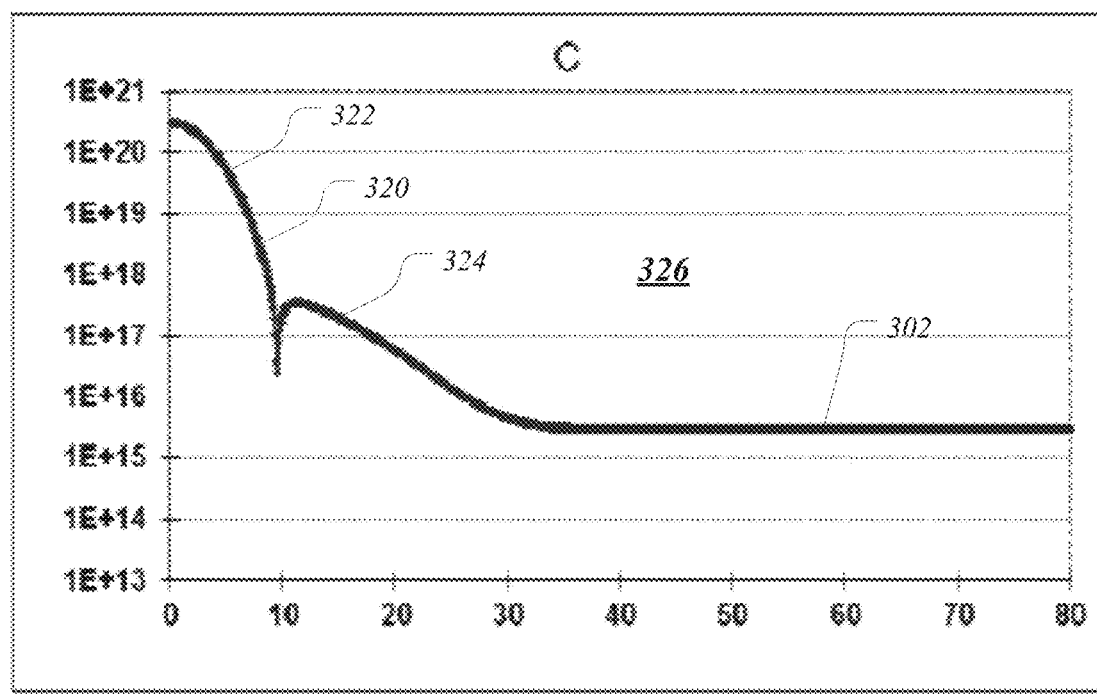
FIG. 3C depicts a further exemplary dopant profile of an overvoltage protection device according to various embodiments of the disclosure.

In further embodiments, an asymmetrical device may be generated by implanting boron on one surface of a silicon substrate and by implanting phosphorous on the other surface of the silicon substrate. In one particular example a 1E15/cm2 dose of phosphorous may be implanted into one surface of a silicon wafer that is also exposed to boron deposition performed at 1100° C. for 1 hour, generating resistance of 0.5 Ohms/square. FIG. 3C depicts an exemplary dopant profile, shown as dopant profile 320, resulting from such a procedure. The dopant profile 320 includes a boron portion 322 representing a dopant profile of boron. As illustrated, the boron surface concentration decreases rapidly to a concentration of approximately $5E16/cm^3$ at a depth of 10 μm below the surface The dopant profile 320 also includes a phosphorous portion 324 representing phosphorous dopant profile. The concentration of phosphorous is increased at the P/N junction to a level greater than $1E17/cm^3$, resulting in a lower breakdown voltage. In this example, the breakdown voltage may be 20V. In some examples, such a profile may be combined with a boron profile such as in FIG. 3A or FIG. 3B on an opposite surface of a silicon substrate, to generate a 20V/250V or 25V/430V asymmetrical device, respectively, where the voltage values represent respective breakdown voltages in opposite directions.

Figure 4A:
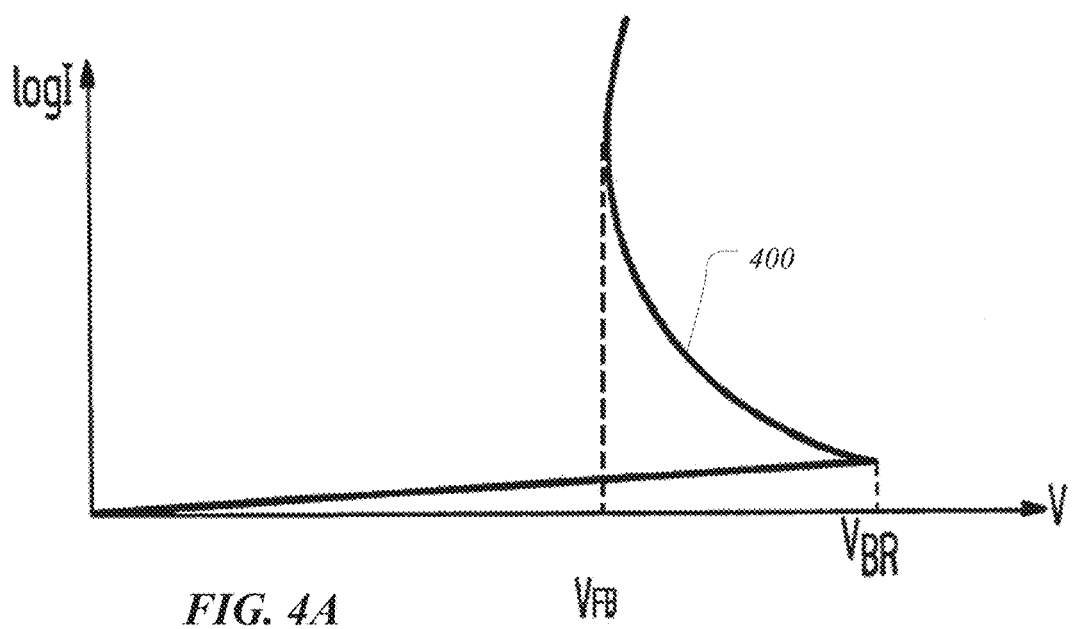
FIG. 4A depicts an exemplary current-voltage curve exhibited by an overvoltage protection device according to an embodiment of the disclosure.

FIG. 4A depicts a current-voltage curve 400 exhibited by an overvoltage protection device according to an embodiment of the disclosure. The current-voltage curve 400 represents the behavior when external voltage is applied between terminals connected to opposing p-doped regions in a PNP three layer device arranged similarly to the device 100. When an external voltage is applied, a first P/N junction becomes forward biased while the second P/N junction becomes reverse biased. As illustrated, the current-voltage curve 400 exhibits a breakdown voltage shown as $V_{BR}$ in this example. The current-voltage curve 400 also exhibits a foldback voltage shown as $V_{FB}$. According to various embodiments of the disclosure, the exact $V_B$ ($V_{BR}$) and amount of foldback may be controlled by adjusting the opposing doping concentration at the breakdown junction of a device, the depth of the breakdown junction and the width of the base (substrate) region that makes up the effective collector, base and emitter of this PNP three layer device.

In order to illustrate certain advantages provided by the present embodiments, by way of background, the relationship between BVceo and BVcbo (collector to base breakdown voltage of a common emitter bipolar device with the base floating) for a bipolar transistor may be expressed as:

$$BVceo = \sqrt[n]{1 - \gamma\alpha}\, BVcbo$$

Where
α is the emitter efficiency
γ is the base transport factor
n is between 3 and 6 depending on the doping profiles The emitter efficiency measures how many minority carriers are injected into the base region from the emitter, while the base transport factor describes how many minority carriers reach the avalanching region at the collector. These factors help determine the gain of the transistor in a bi-directional transient voltage suppression (TVS) device. As can be seen from the BVceo equation, either or the base transport factor and emitter efficiency, or the two, are to be kept low to avoid making BVceo much lower than BVcbo. At low currents, emitter efficiency is low because minority carriers recombine in the emitter base (EB) depletion layer. As the current increases, the amount of recombination in the EB depletion layer saturates and transistor gain increases with current. This explains the observed reduction in BVceo as the device current increases. At even higher currents, the base region of the transistor becomes conductivity modulated and the emitter efficiency eventually falls again to give an increasing BVceo.

In order to avoid excessive foldback the current gain of a transistor may be kept low. High voltage TVS devices may use a low doped base region. The low doped base region may increase the emitter efficiency and therefore the gain of the transistor. A different approach is needed to reduce transistor gain at these higher voltages.

In the present embodiments, the mechanism of minority carrier lifetime reduction may be employed to lower the base transport factor in a bi-directional TVS device. In various embodiments, a lifetime-reduction dopant such as gold or platinum may be diffused into the wafer to decrease the number of minority carriers injected from the forward biased junction of the bi-directional TVS and arriving at the avalanche region.

In other embodiments, another method to suppress minority carrier lifetime involves the use of electron irradiation after the complete set of diffusion processes are performed. An advantage of these embodiments includes reduced risk of contaminating other diffusion processes requiring relatively higher silicon lifetime with heavy metals. Another advantage is the ability to closely control the minority carrier lifetime at the end stages of substrate processing. By employing varying amounts of electron radiation the minority carrier lifetime in a semiconductor such as silicon may be reduced to varying degrees, the minority carries injected form an emitter (such as a first p-type region) across a base (body region) may be adjusted, thus adjusting the gain of the transistor so that different amounts of foldback are obtained. Generally, higher transistor gain leads to higher degree of foldback. In various embodiments, the base (body region) of a three layer device may be wider than conventional transistors, such as a base width of 100 μm or 1000 μm. By varying a dose of electrons, the foldback and transistor gain in such a device may be varied to tailor the foldback according to an application. Exemplary ranges of electron irradiation include 3 kGy to 30 kGy. The embodiments are not limited in this context.

Figure 4B:
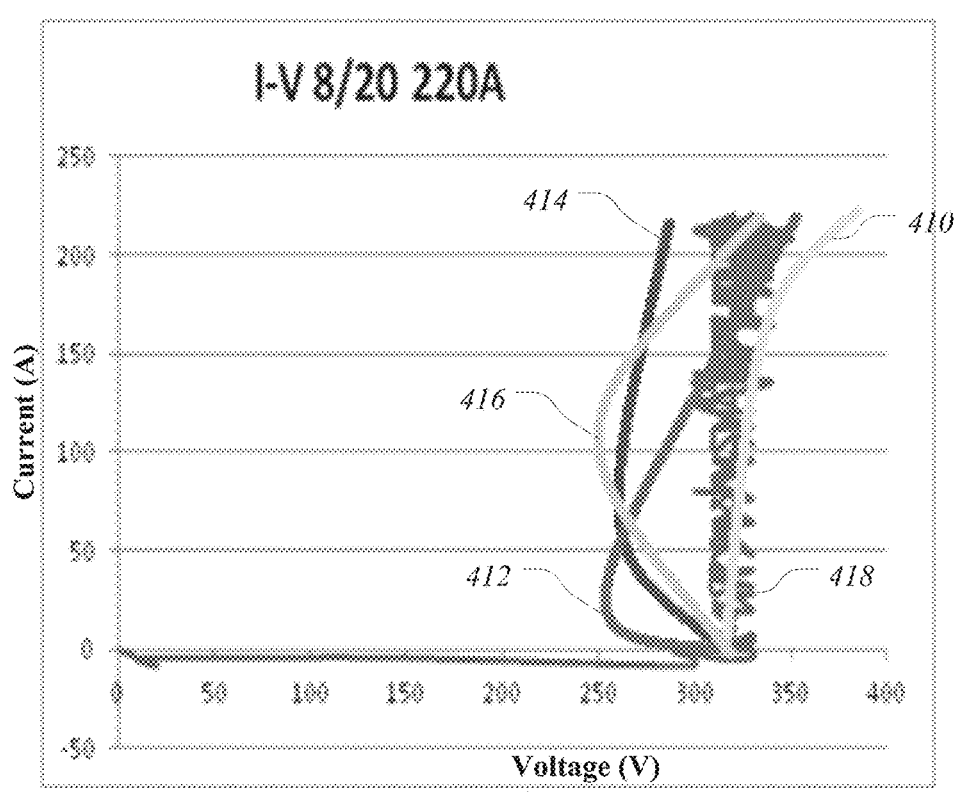
FIG. 4B depicts further exemplary current-voltage curves.

FIG. 4B depicts further exemplary current-voltage curves. In FIG. 4B the curves may represent device response to a standard an industry standard impulse 8/20 μs (lightning surge) waveform. The curve 410 represents the behavior of a conventional avalanche diode, exhibiting no foldback. The curve 412 represents a calculated response in which gain is observed at relatively low currents, with reducing gain as the current increases. The curve 414 is a calculated curve that exhibits gain at higher current that that or curve 412, while curve 418 is a calculated curve that exhibits gain at even higher current values. The curve 418 shows experimental data from an actual device fabricated according to embodiments of the disclosure. In this example, the voltage fluctuates slightly while showing on average a near vertical conduction characteristic, meaning that voltage does not systematically vary with current. As discussed above, devices exhibiting the behavior shown by the different curves may be fabricated by varying the degree of electron irradiation to control the foldback behavior.

Figure 5:
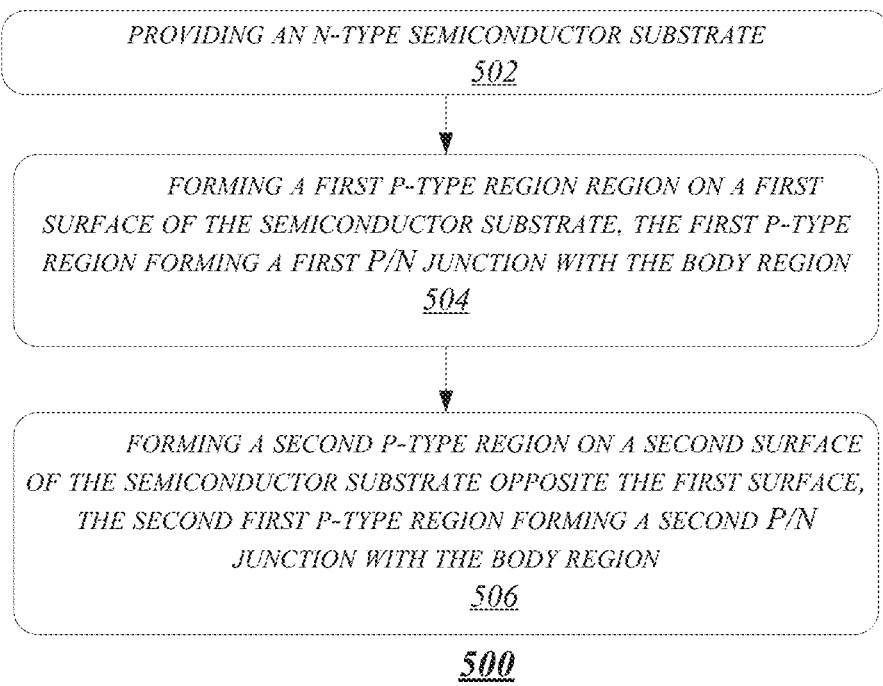
FIG. 5 presents an exemplary process flow.

FIG. 5 depicts an exemplary process flow 500. At block 502 an N-type semiconductor substrate is provided. In various embodiments, the semiconductor substrate may be n-doped having a concentration of n-type dopants between $1E13/cm^3$ to $1E16/cm^3$. At block 504 a first p-type region is formed on a first surface of the semiconductor substrate, where the first p-type region forms a P/N junction with a body region of the semiconductor substrate. At block 504 a first p-type region is formed on a first surface of the semiconductor substrate such as silicon, where the first p-type region forms a P/N junction with a body region of the semiconductor substrate. In some embodiments the first p-type region, second p-type region, or the two, may be doped at a concentration levels of $1E18/cm^3$ to $1E21/cm^3$. In some embodiments, the surface concentration of the first p-type region, second p-type region, or the two may be between $1E19/cm^3$ to $1E20/cm^3$. In various embodiments, the thickness of the p-type regions may vary between 5 µm to 30 µm. In some embodiments, the semiconductor substrate may have a thickness arranged to generate a thickness of an n-type body region between the first p-type region and second p-type region of between 100 µm and 1000 µm. The n-type body region may act as a base of a PNP transistor in which the thickness of the base in the direction of current flow, equivalent to the base width, is much greater than the thickness of the emitter or collector in the direction of current flow.

Figure 6:
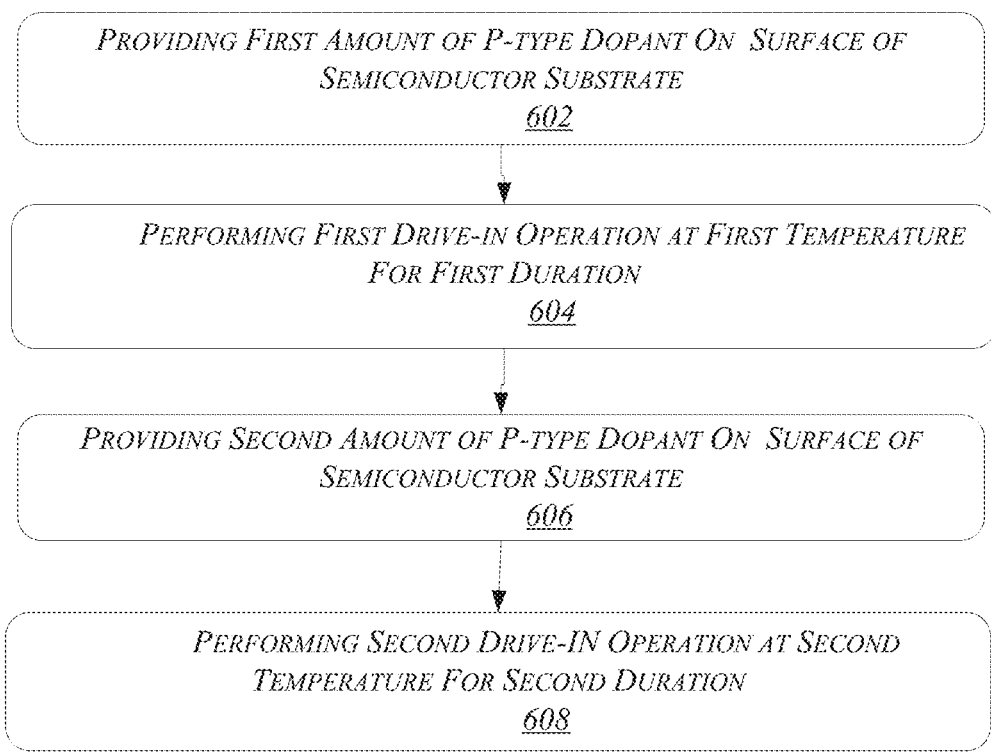
FIG. 6 presents another exemplary process flow.

FIG. 6 depicts another exemplary process flow 600. At block 602 a first amount of p-type dopant is provided on an N-type semiconductor substrate. In various embodiments, the semiconductor substrate may be n-doped having a concentration of n-type dopants between $1E13/cm^3$ to $1E16/cm^3$. At block 604 a first drive-in operation is performed at a first temperature for a first duration. The first deposition and first drive-in operation may be adequate to generate a deep P/N junction at a target depth within the N-type substrate. In various embodiments, the target depth for the deep P/N junction may vary between 5 µm to 30 µm. The first deposition and first drive in operation may generate a first p-type peak dopant concentration at the surface of the semiconductor device in the range of $1E17/cm^3$ to $1E22/cm^3$. At block 606 a second amount of p-type dopant is provided on an N-type semiconductor substrate. At block 608 a second drive-in operation is performed at a second temperature for a second duration. The second deposition and second drive-in operation may be adequate to increase a concentration at the surface of the semiconductor device above the first concentration. In some examples, the second concentration may be greater than $1E19/cm^3$.

While the present embodiments have been disclosed with reference to certain embodiments, numerous modifications, alterations and changes to the described embodiments are possible without departing from the sphere and scope of the present disclosure, as defined in the appended claims. Accordingly, it is intended that the present embodiments not be limited to the described embodiments, but that it has the full scope defined by the language of the following claims, and equivalents thereof.

What is claimed is:

1. A method of fabricating a semiconductor device, comprising:
   providing an n-type semiconductor substrate;
   forming a first p-type region in a first surface region of the n-type semiconductor substrate, the first p-type region forming a first P/N junction with the n-type semiconductor substrate, the first p-type region having a surface dopant concentration of $3E20/cm^3$, and decreasing to a concentration of $3E15/cm^3$ at a depth of 12 µm below the first surface region; and
   forming a second p-type region in a second surface region of the n-type semiconductor substrate opposite the first surface region, the second p-type region forming a second P/N junction with the n-type semiconductor substrate, the second p-type region having a surface dopant concentration of $3E20/cm^3$, and decreasing to a concentration of $3E15/cm^3$ at a depth of 12 µm below the second surface region;
   wherein the n-type semiconductor substrate, first p-type region, and second p-type region form a breakdown device having a breakdown voltage of 250V in response to an external voltage applied between the first surface region and second surface region.

2. The method of claim 1, wherein the n-type semiconductor substrate forms an n-type region disposed between the first p-type region and second p-type body region.

3. The method of claim 2, wherein the forming the first p-type region and forming the second p-type region comprises driving a p-type dopant into the first p-type region and second p-type region in a plurality of drive-in operations.

4. The method of claim 1, wherein the forming the first p-type region is performed simultaneously with the forming the second p-type region.

5. The method of claim 1, wherein the forming the first p-type region and forming the second p-type region comprise exposing the n-type semiconductor substrate to $BBr_3$.

6. The method of claim 1, wherein the forming the first p-type region and forming the second p-type region comprise performing at least one drive in operation at 1300° C. to 1350° C.

7. The method of claim 1, wherein the forming the first p-type region and forming the second p-type region comprise implanting boron-containing ions into the first surface region and the second surface region.

8. A method of fabricating a semiconductor device, comprising:
   providing an n-type semiconductor substrate;
   forming a first p-type region in a first surface region of the n-type semiconductor substrate, the first p-type region forming a first P/N junction with the n-type semiconductor substrate, the first p-type region having a surface dopant concentration of $3E20/cm^3$, and decreasing to a concentration of $3E15/cm^3$ at a depth of 20-22 µm below the first surface region; and
   forming a second p-type region in a second surface region of the n-type semiconductor substrate opposite the first surface region, the second p-type region forming a second P/N junction with the n-type semiconductor substrate, the second p-type region having a surface dopant concentration of $3E20/cm^3$, and decreasing to a concentration of $3E15/cm^3$ at a depth of 20-22 µm below the second surface region;
   wherein the n-type semiconductor substrate, first p-type region, and second p-type region form a breakdown device having a breakdown voltage of 430V in response to an external voltage applied between the first surface region and second surface region.

9. The method of claim 8, wherein the n-type semiconductor substrate forms an n-type body region disposed between the first p-type region and second p-type region.

10. The method of claim 9, wherein the forming the first p-type region and forming the second p-type region comprise driving a p-type dopant into the first p-type region and second p-type region in a plurality of drive-in operations.

11. The method of claim 8, wherein the forming the first p-type region is performed simultaneously with the forming the second p-type region.

12. The method of claim 8, wherein the forming the first p-type region and forming the second p-type region comprise exposing the n-type semiconductor substrate to $BBr_3$.

13. The method of claim 8, wherein the forming the first p-type region and forming the second p-type region comprise performing at least one drive in operation at 1300° C. to 1350° C.

14. The method of claim 8, wherein the forming the first p-type region and forming the second p-type region comprise implanting boron-containing ions into the first surface region and the second surface region.

* * * * *